(12) United States Patent
Rudeck et al.

(10) Patent No.: US 7,272,039 B2
(45) Date of Patent: Sep. 18, 2007

(54) MINIMIZING ADJACENT WORDLINE DISTURB IN A MEMORY DEVICE

(75) Inventors: Paul J. Rudeck, Boise, ID (US); Andrei Mihnea, Boise, ID (US); Andrew Bicksler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/417,574

(22) Filed: May 4, 2006

(65) Prior Publication Data

US 2006/0198221 A1 Sep. 7, 2006

Related U.S. Application Data

(62) Division of application No. 10/881,951, filed on Jun. 30, 2004.

(51) Int. Cl.
G11C 16/04 (2006.01)
G11C 16/06 (2006.01)

(52) U.S. Cl. ............... 365/185.02; 365/185.17; 365/185.18; 365/185.23; 365/185.28

(58) Field of Classification Search ........... 365/185.02, 365/185.17, 185.18, 185.23, 185.28
See application file for complete search history.

(56) References Cited

U.S. PATENT DOCUMENTS

| 5,621,684 | A | | 4/1997 | Jung |
| 5,638,327 | A | * | 6/1997 | Dallabora et al. ...... 365/185.15 |
| 5,671,176 | A | * | 9/1997 | Jang et al. ............. 365/185.02 |
| 5,677,875 | A | | 10/1997 | Yamagata et al. |
| 5,715,194 | A | | 2/1998 | Hu |
| 5,912,837 | A | * | 6/1999 | Lakhani ................. 365/185.02 |
| 5,917,757 | A | | 6/1999 | Lee et al. |
| 5,959,892 | A | | 9/1999 | Lin |
| 5,991,202 | A | | 11/1999 | Derhacobian |
| 6,061,270 | A | | 5/2000 | Choi |
| 6,107,658 | A | | 8/2000 | Itoh et al. |
| 6,240,016 | B1 | | 5/2001 | Haddad |
| 6,469,933 | B2 | | 10/2002 | Choi |
| 6,504,757 | B1 | * | 1/2003 | Hollmer et al. ........ 365/185.18 |
| 6,620,682 | B1 | | 9/2003 | Lee |
| 6,657,915 | B2 | | 12/2003 | Seo |
| 6,987,694 | B2 | * | 1/2006 | Lee ....................... 365/185.17 |
| 2002/0060926 | A1 | | 5/2002 | Choi |

(Continued)

OTHER PUBLICATIONS

T. Jung et al., "A 117-mm2 3.3-V Only 128-Mb Multilevel NAND Flash Memory for Mass Storage Applications" IEEE Journal of Solid-State Circuits, IEEE Inc., New York, NY, U.S., vol. 31, No. 11, Nov. 1996, pp. 1575-1583.

(Continued)

Primary Examiner—Amir Zarabian
Assistant Examiner—Ly Duy Pham
(74) Attorney, Agent, or Firm—Leffert Jay & Polglaze, P.A.

(57) ABSTRACT

A selected wordline that is coupled to cells for programming is biased with a programming voltage. The unselected wordlines that are adjacent to the selected wordline are biased at a first predetermined voltage. The remaining wordlines are biased at a second predetermined voltage that is greater than the first predetermined voltage. The first predetermined voltage is selected by determining what unselected, adjacent wordline bias voltage produces a minimized $V_{pass}$ disturb in response to the selected wordline programming voltage.

14 Claims, 4 Drawing Sheets

U.S. PATENT DOCUMENTS

| | | |
|---|---|---|
| 2002/0075727 A1 | 6/2002 | Jeong |
| 2002/0118569 A1 | 8/2002 | Jeong et al. |
| 2002/0149958 A1 | 10/2002 | Kunikiyo |
| 2002/0167844 A1* | 11/2002 | Han et al. .............. 365/185.28 |
| 2002/0191439 A1* | 12/2002 | Caywood ............... 365/185.06 |
| 2004/0012998 A1* | 1/2004 | Chien et al. ............. 365/185.2 |
| 2004/0080980 A1* | 4/2004 | Lee ....................... 365/185.17 |
| 2005/0254309 A1 | 11/2005 | Kwon et al. |
| 2006/0023502 A1 | 2/2006 | Cernea et al. |

OTHER PUBLICATIONS

K. Suh et al., "A 3.3 V 32 Mb NAND Flash Memory with Incremental Step Pulse Programming Scheme" IEEE Journal of Solid-State Circuits, IEEE Inc., New York, NY, vol. 30, No. 11, Nov. 1995, pp. 1149-1156.

\* cited by examiner

MINIMIZING ADJACENT WORDLINE DISTURB IN A MEMORY DEVICE

RELATED APPLICATION

This Application is a Divisional of U.S. application Ser. No. 10/881,951 titled "MINIMIZING ADJACENT WORDLINE DISTURB IN A MEMORY DEVICE" filed Jun. 30, 2004 (Pending) which is commonly assigned and incorporated herein by reference.

TECHNICAL FIELD OF THE INVENTION

The present invention relates generally to memory devices and in particular the present invention relates to programming of non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures. These architectures are named for the resemblance that the basic memory cell configuration of each architecture has to a basic NAND or NOR gate circuits, respectively.

In the NOR array architecture, the floating gate memory cells of the memory array are arranged in a matrix. The gates of each floating gate memory cell of the array matrix are connected by rows to word select lines (wordlines) and their drains are connected to column bitlines. The source of each floating gate memory cell is typically connected to a common source line. The NOR architecture floating gate memory array is accessed by a row decoder activating a row of floating gate memory cells by selecting the wordline connected to their gates. The row of selected memory cells then place their stored data values on the column bitlines by flowing a differing current if in a programmed state or not programmed state from the connected source line to the connected column bitlines.

A NAND array architecture also arranges its array of floating gate memory cells in a matrix such that the gates of each floating gate memory cell of the array are connected by rows to wordlines. Each memory cell, however, is not directly connected to a source line and a column bit line. The memory cells of the array are instead arranged together in strings, typically of 8, 16, 32, or more each, where the memory cells in the string are connected together in series, source to drain, between a common sourceline and a column bitline. The NAND architecture floating gate memory array is then accessed by a row decoder activating a row of floating gate memory cells by selecting the word select line connected to their gates. In addition, the wordlines connected to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the sourceline to the column bitline through each floating gate memory cell of the series connected string, restricted only by the memory cells of each string that are selected to be read. This places the current encoded stored data values of the row of selected memory cells on the column bitlines.

FIG. 1 illustrates a column of a typical prior art NAND flash memory device. The selected wordline for the flash memory cells being programmed is typically biased at a voltage that is greater than 16V. The illustrated wordline 100 of the cell to be programmed is biased at 19V. The unselected wordlines for the remaining cells are typically biased at approximately 10V. As NAND flash memory is scaled, parasitic capacitance coupling 101-104 between the selected wordline and adjacent floating gates (FG) and control gates (CG) becomes problematic. Because of the parasitic coupling, the adjacent cells are more prone to $V_{pass}$ disturb than the other cells that also share the common bitline with the cells being programmed.

For the reasons stated above, and for other reasons stated below which will become apparent to those skilled in the art upon reading and understanding the present specification, there is a need in the art for a way to minimize programming induced $V_{pass}$ and adjacent wordline stress between a selected wordline and adjacent unselected wordlines.

DETAILED DESCRIPTION

Figure 1:
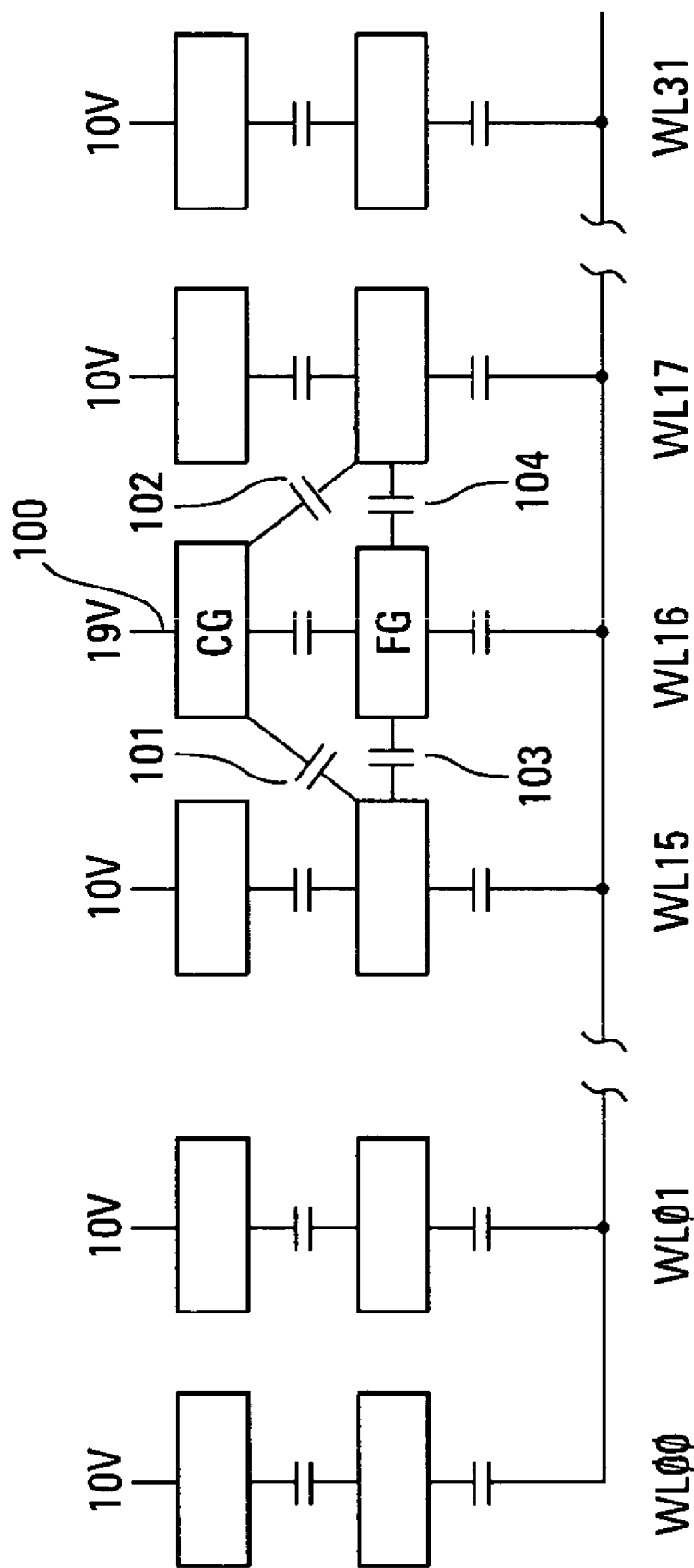
FIG. 1 shows a typical prior art NAND architecture memory array with wordline biasing.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
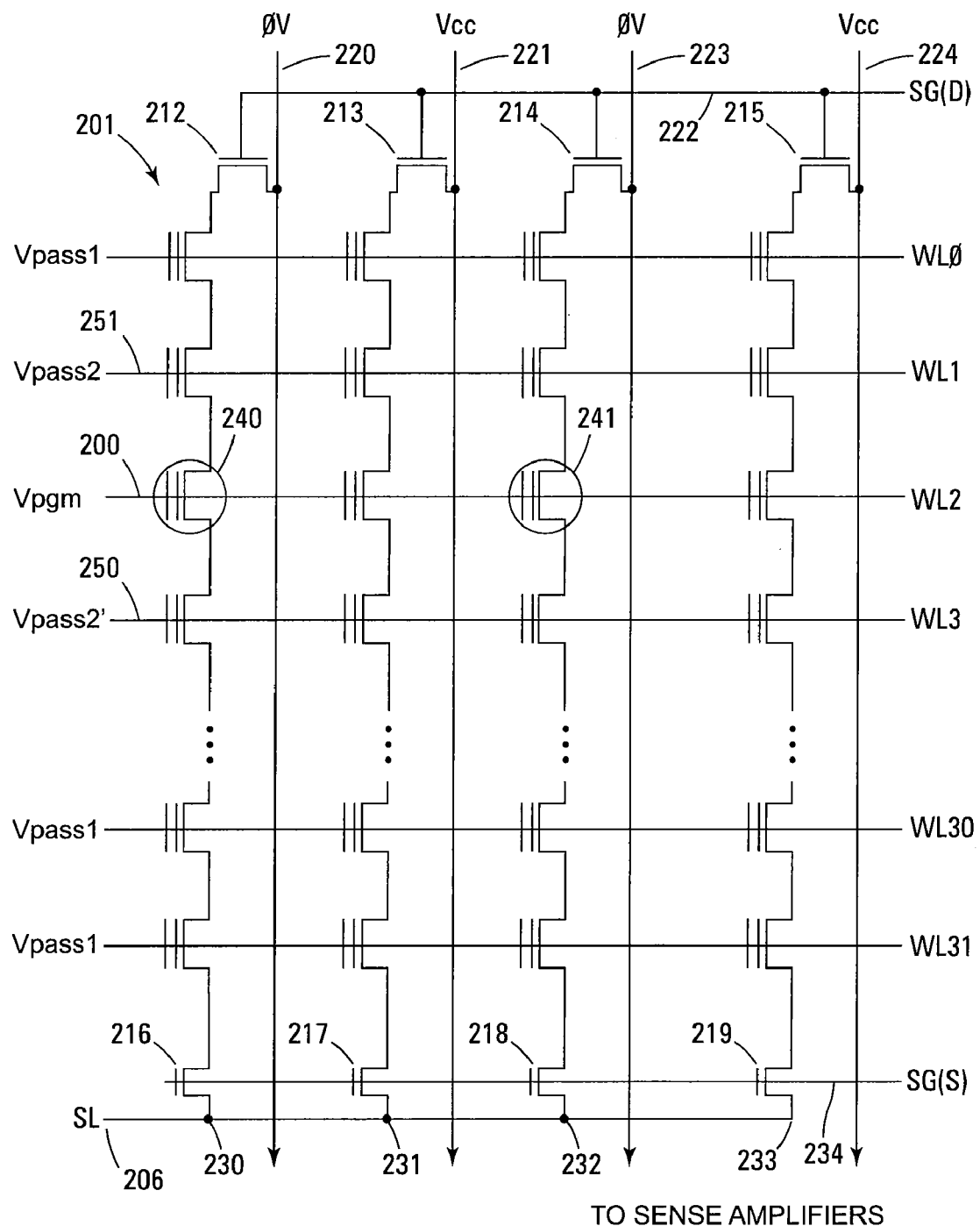
FIG. 2 shows a diagram of one embodiment for a flash memory array of the present invention with wordline biasing.

FIG. 2 illustrates a diagram of one embodiment for a flash memory array of the present invention with wordline biasing levels. The memory array of FIG. 2, for purposes of clarity, does not show all the elements typically required in a memory array. For example, only four bitlines are shown 220, 221, 223 and 224 when the number of bitlines required actually depends upon the memory density.

The array is comprised of an array of floating gate cells 201 arranged in series strings 230-233. Each of the floating gate cells 201 are coupled drain to source in each series chain 230-233. A word line (WL0-WL31) that spans across multiple series strings 230-233 is coupled to the control gates of every floating gate cell in a row in order to control their operation. The bitlines 220, 221, 223 and 224 are eventually coupled to sense amplifiers (not shown) that detect the state of each cell.

In operation, the wordlines (WL0-WL31) select the individual floating gate memory cells in the series chain 230-233 to be written to or read from and operate the remaining floating gate memory cells in each series string 230-233 in a pass though mode. Each series string 230-233 of floating gate memory cells is coupled to a source line 206 by a source select gate 216-219 and to an individual bitline 220, 221, 223 and 224 by a drain select gate 212-215. The source select gates 216-219 are controlled by a source select gate control line SG(S) 234 coupled to their control gates. The drain select gates 212-215 are controlled by a drain select gate control line SG(D) 222.

In the embodiment illustrated in FIG. 2, one wordline is selected for programming of certain cells in the row. In this embodiment, two cells 240 and 241 are to be programmed so that their bitlines 220 and 223 are at ground potential (0V). The remaining unselected bitlines 221 and 224 are biased at $V_{cc}$.

The wordline 200 for the selected row is biased at a $V_{pgm}$ voltage. In one embodiment, this voltage is greater than 16V. In another embodiment, the $V_{pgm}$ voltage is in a range of 15V-21V. Alternate embodiments may use other programming voltages or voltage ranges. For example, the $V_{pgm}$ voltage could go lower or higher depending on the tunnel oxide thickness, the oxide-nitride-oxide thickness, the physical dimensions of the cell (for direct gate coupling), and the pitch of the array (for parasitic coupling).

Unselected wordlines that are not adjacent to the selected wordline 200 are biased at a $V_{pass1}$ voltage. This voltage might range from 8 to 11V. In one embodiment, $V_{pass1}$=10V. Alternate embodiments may use other wordline voltages to bias non-adjacent, unselected wordlines during a program operation.

In order to reduce the problems with $V_{pass}$ disturb and adjacent wordline stress in adjacent rows and cells, the wordlines for the unselected rows 250 and 251 adjacent to the selected row are biased at a different voltage ($V_{pass2}$) than the remaining unselected wordlines. In one embodiment, $V_{pass2}$ is less than $V_{pass1}$. In another embodiment, $V_{pass2}$ is 9V when $V_{pass1}$ is 10V.

In one embodiment, $V_{pgm}$ on the selected wordline is incrementally increased for every programming pulse during a programming operation. In such an embodiment, a starting voltage is chosen as is a step voltage by which the starting voltage is increased every programming pulse, up to a maximum number of pulses. In such an embodiment, $V_{pass2}$ on the adjacent, unselected wordlines can either be held constant or incrementally decreased with the $V_{pgm}$ increases. If $V_{pass2}$ is held constant, a desired voltage that results in minimal adjacent wordline disturb over the range of $V_{pgm}$ voltages can be found empirically.

If $V_{pass2}$ is decreased as $V_{pgm}$ is increased, $V_{pass2}$ can be ramped downward using various methods. In one embodiment, $V_{pass2}$ is stepped down incrementally as some fraction of the step up voltage used for $V_{pgm}$. For example, if $V_{pgm}$ starts at 16.4V and the step voltage is +0.6V, $V_{pass2}$ might start at 9.6V with a step voltage of -0.2V (i.e., ⅓ of the $V_{pgm}$ step). Therefore, $V_{pgm}$ pulses would be 16.4V, 17.0V, 17.6V, and 18.2V. $V_{pass2}$ would therefore be 9.6V, 9.4V, 9.2V, and 9.0V respectively.

In another embodiment, $V_{pass2}$ may be a set fraction of $V_{pgm}$ so that as $V_{pgm}$ ramps up, $V_{pass2}$ remains a preset percentage of $V_{pgm}$. For example, $V_{pass2}$ may be 0.47$V_{pgm}$. Alternate embodiments may use other percentages of $V_{pgm}$.

$V_{pass2}$ can be determined empirically by testing a flash memory device during manufacture to determine what $V_{pass2}$ produces the least amount of $V_{pass}$ disturb in cells in the unselected, adjacent rows. This voltage can then be used for other flash memory devices.

In yet another embodiment, to take into account differences in flash memory dies, a number of voltage trims (e.g., 10V, 9V, 8V, 7V, 6V) can be built into the memory device. Each individual memory device can then be tested at different $V_{pass2}$ voltages to determine which voltage option provides the least amount of program disturb. The selected $V_{pass2}$ is then used in that particular die.

In still another embodiment, $V_{pass2}$ may be different depending on the distance of the adjacent, unselected wordline from array ground or the select gate so that each adjacent, unselected wordline has a different wordline bias voltage. In other words, the adjacent, unselected wordline closest to the source line of the array may have a different $V_{pass2}$ voltage (i.e., $V_{pass2}$) than the adjacent, unselected wordline closest to the drain line of the array.

Figure 3:
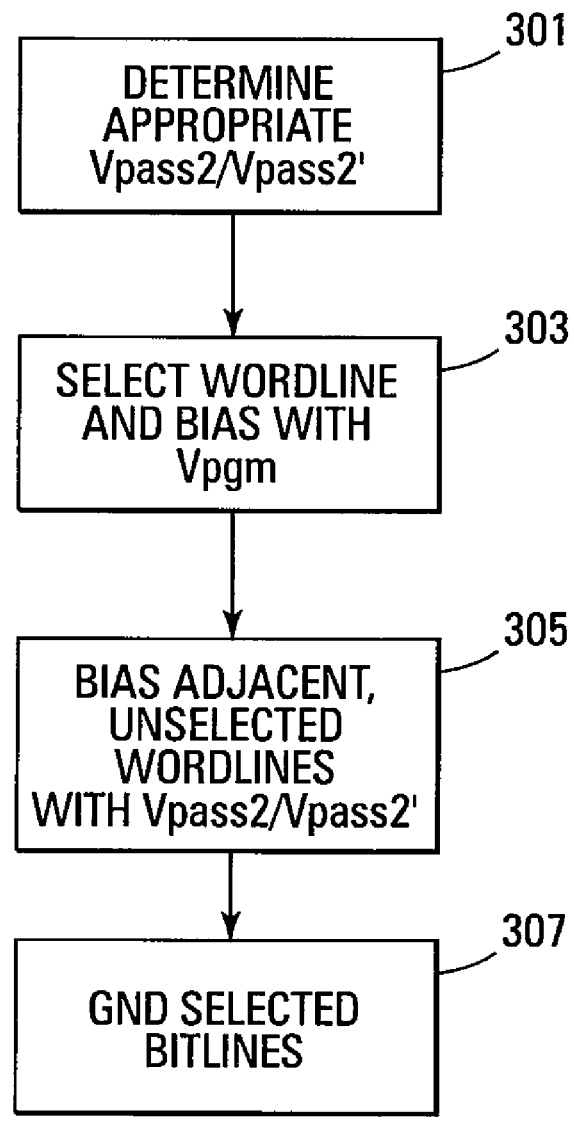
FIG. 3 shows a flowchart of one embodiment of a method of the present invention for programming memory cells in a flash memory array.

FIG. 3 illustrates a flowchart of one embodiment of a method of the present invention for programming memory cells in a flash memory array. An appropriate $V_{pass2}$ voltage is determined at some point as described previously 301. The selected wordline of the row in which the desired cells are to be programmed is biased with a programming pulse having an amplitude of $V_{pgm}$ 303.

The adjacent, unselected wordlines are biased with the appropriate $V_{pass2}$ 305 in order to reduce or eliminate $V_{pass}$ stress and adjacent wordline stress. The selected bitlines coupled to the cells to be programmed are biased at ground level 307.

Figure 4:
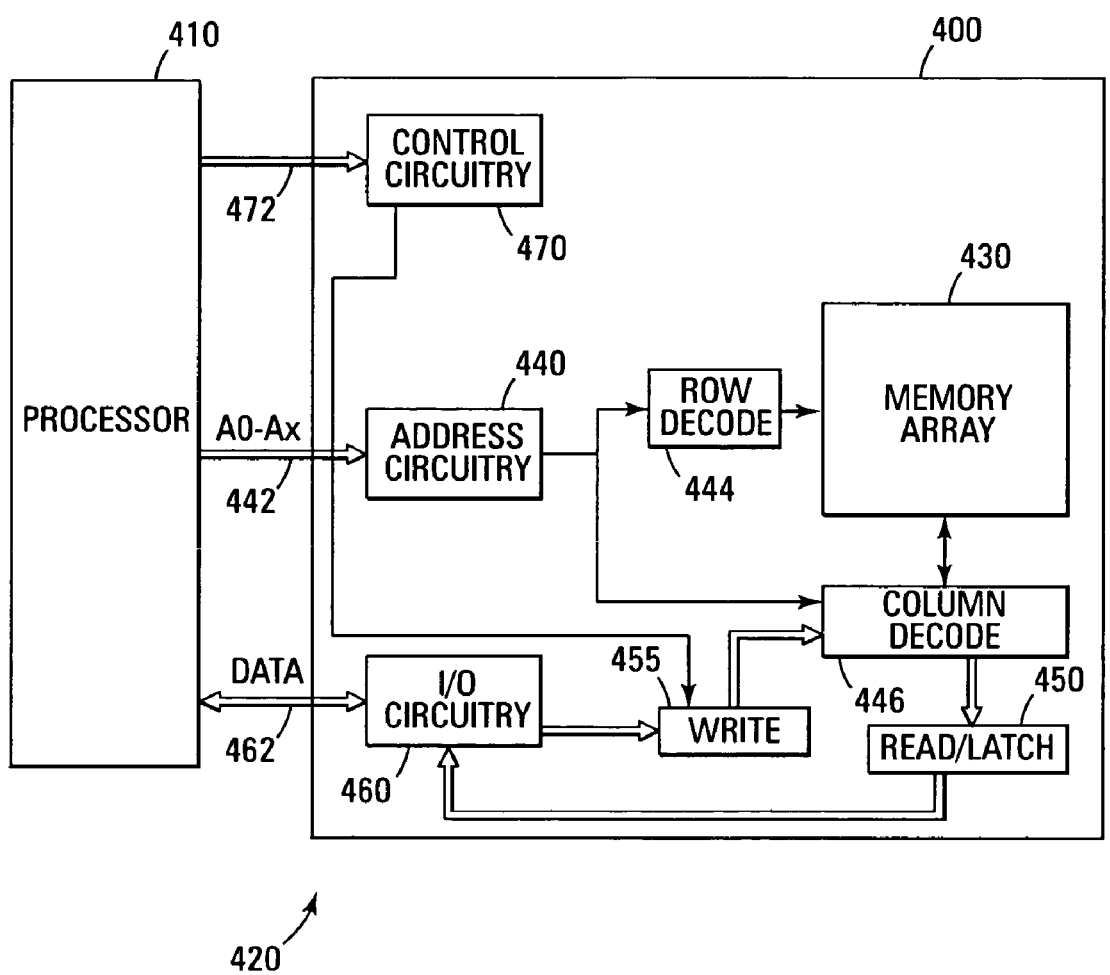
FIG. 4 shows a block diagram for one embodiment of an electronic system of the present invention.

FIG. 4 illustrates a functional block diagram of a memory device 400 that can incorporate the flash memory cells of the present invention. The memory device 400 is coupled to a processor 410. The processor 410 may be a microprocessor or some other type of controlling circuitry. The memory device 400 and the processor 410 form part of an electronic system 420. The memory device 400 has been simplified to focus on features of the memory that are helpful in understanding the present invention.

The memory device includes an array of flash memory cells 430. The memory array 430 is arranged in banks of rows and columns. The control gates of each row of memory cells is coupled with a wordline while the drain and source connections of the memory cell columns are coupled to bitlines. As is well known in the art, the connection of the cells to the bitlines depends on whether the array is a NAND architecture or a NOR architecture.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense amplifier/buffer circuitry 450. The sense amplifier/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write, and erase operations. The control circuitry 470 may be a state machine, a sequencer, or some other type of controller. The control circuitry 470 of the present invention, in one embodiment, is responsible for executing the method of the present invention for controlling the values of the programming voltage, the voltages on the adjacent, unselected wordlines, and the voltages on the non-adjacent, unselected wordlines.

The flash memory device illustrated in FIG. 4 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

CONCLUSION

In summary, the embodiments of the present invention provide a way to reduce or eliminate the $V_{pass}$ disturb on the closest, adjacent cells that are not being programmed. This can be accomplished by reducing the unselected wordline voltage for wordlines adjacent to the selected wordline.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for reducing adjacent word line disturb in a memory device having an array ground and a plurality of word lines each coupling a row of memory cells, the method comprising:
    biasing a selected word line with a programming voltage;
    determining a level of $V_{pass}$ disturb on adjacent word lines to the selected word line;
    biasing a first adjacent word line with a different bias voltage than a second adjacent word line; and
    adjusting the biasing of the first and the second adjacent word lines in response to their proximity to the array ground such that the level of $V_{pass}$ disturb in the adjacent word lines is substantially reduced.

2. The method of claim 1 wherein adjusting biasing starts at a first predetermined voltage that is less than a second predetermined voltage used to bias remaining word lines.

3. The method of claim 1 wherein the biasing of the adjacent word lines changes over time in response to the biasing of the selected word line.

4. The method of claim 1 and further including adjusting the biasing of the adjacent word lines in response to changes in the programming voltage.

5. The method of claim 1 wherein biasing each adjacent word line is a predetermined fraction of the programming voltage.

6. A flash memory device comprising:
    a memory cell array comprising a plurality of cells arranged in rows coupled by a word line and columns coupled to a bit line, the array having a source line and a drain line; and
    control circuitry for controlling biasing of the word lines wherein the control circuitry is adapted to bias a selected word line with a programming voltage, determine a level of $V_{pass}$ disturb on adjacent word lines to the selected word line, adjust biasing of the adjacent word lines such that the level of $V_{pass}$ disturb in the adjacent word lines is substantially reduced, decrease the bias on the adjacent word lines in response to an increase of the programming voltage, and decrease the bias on the adjacent word line closest to the source line a different amount than the word line closest to the drain line.

7. The device of claim 6 wherein the control circuitry is further adapted to decrease the bias of each adjacent word line by a predetermined step voltage.

8. The device of claim 6 wherein the control circuitry is further adapted to decrease the bias of each adjacent word line by a predetermined percentage of the programming voltage.

9. The device of claim 6 and further including a plurality of voltage trims coupled to the control circuitry for testing the memory cell array at different $V_{pass}$ voltages.

10. A memory system comprising:
    a processor that generates memory control signals; and
    a memory device coupled to the processor that operates in response to the memory control signals, the memory device comprising:
        a memory cell array comprising a plurality of cells arranged in rows coupled by word lines and columns coupled to bit lines, the array having a source line and a drain line; and
        control circuitry for controlling biasing of the word lines wherein the control circuitry is adapted to bias a selected word line with a programming voltage, determine a level of $V_{pass}$ disturb on a first and second adjacent word line to the selected word line, and adjust biasing of the adjacent word lines in response to their proximity to the drain line such that the level of $V_{pass}$ disturb in the adjacent word lines is substantially reduced.

11. The system of claim 10 wherein the control circuitry is further adapted to change the biasing of the adjacent word lines over time in response to the biasing of the selected word line.

12. The system of claim 10 wherein the control circuitry is further adapted to bias each adjacent word line at a predetermined fraction of the programming voltage.

13. A memory system comprising:
    a processor that generates memory control signals; and
    a memory device coupled to the processor that operates in response to the memory control signals, the memory device comprising:
        a memory cell array comprising a plurality of cells arranged in rows coupled by word lines and columns coupled to bit lines, the array having a source line and a drain line; and control circuitry for controlling biasing of the word lines wherein the control circuitry is adapted to bias a selected word line with a programming voltage, determine a level of $V_{pass}$ disturb on adjacent word lines to the selected word line, bias the adjacent word lines at a predetermined percentage of the programming voltage wherein the predetermined percentage is different for a first word line closest to the source line than for a second word line closest to the drain line, and adjust biasing of the adjacent word lines such that the level of $V_{pass}$ disturb in the adjacent word lines is substantially reduced.

14. The system of claim 13 wherein each predetermined percentage remains constant as the control circuit changes the programming voltage.

* * * * *